United States Patent [19]

Wilkerson

[11] Patent Number: 4,914,383
[45] Date of Patent: Apr. 3, 1990

[54] NON-CONTACT AMMETER

[76] Inventor: Alan W. Wilkerson, 410 Madero Dr., Thiensville, Wis. 53092

[21] Appl. No.: 386,028

[22] Filed: Jul. 26, 1989

Related U.S. Application Data

[63] Continuation of Ser. No. 785,972, Oct. 10, 1985, abandoned.

[51] Int. Cl.⁴ .................. G01R 1/22; G01R 33/00
[52] U.S. Cl. .................. 324/127; 324/117 R; 324/117 H
[58] Field of Search ............... 324/127, 117 R, 117 H, 324/99 R, 99 D

[56] References Cited

U.S. PATENT DOCUMENTS

| | | |
|---|---|---|
| 2,886,779 | 5/1959 | Kuhrt et al. . |
| 3,199,026 | 8/1965 | Leibowitz . |
| 3,219,930 | 11/1965 | Sipler . |
| 3,226,640 | 12/1965 | Kuhrt et al. . |
| 3,323,056 | 5/1967 | Haley . |
| 3,323,057 | 5/1967 | Haley . |
| 3,418,575 | 12/1968 | Spindle . |
| 3,422,351 | 1/1969 | Pihl . |
| 3,454,879 | 7/1969 | Smitka ...................... 324/117 |
| 3,525,041 | 8/1970 | Velsink . |
| 3,573,616 | 4/1971 | Kahen . |
| 3,634,875 | 1/1972 | Bixby ....................... 324/117 R |
| 3,649,912 | 3/1972 | Nakamura . |
| 3,699,442 | 10/1972 | Riley ........................ 324/117 R |
| 3,768,011 | 10/1973 | Swain ....................... 324/117 R |
| 4,011,505 | 3/1977 | Spalding .................... 324/117 R |
| 4,298,838 | 11/1981 | Akamatsu et al. ............. 324/117 R |

Primary Examiner—Ernest F. Karlsen
Attorney, Agent, or Firm—Andrus, Sceales, Starke & Sawall

[57] ABSTRACT

A non-contact ammeter for measuring direct current in a conductor has a core capable of carrying a magnetic flux. The core surrounds the conductor so that the latter serves as a primary winding for the core. A second winding on the core is inductively coupled to the conductor. A current indicator is connected to the second winding. A control establishes the voltage on the second winding and flux changes in the core to avoid or limit saturation of the core. The control may be responsive to the flux condition of the core.

20 Claims, 4 Drawing Sheets

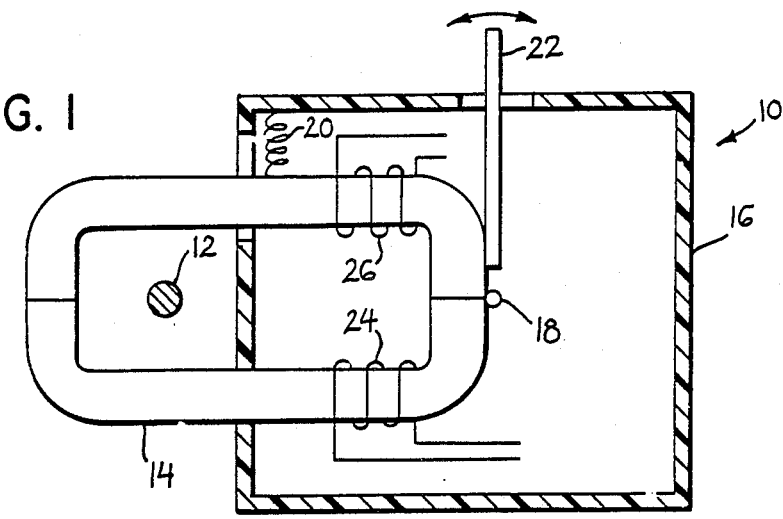
FIG. 1
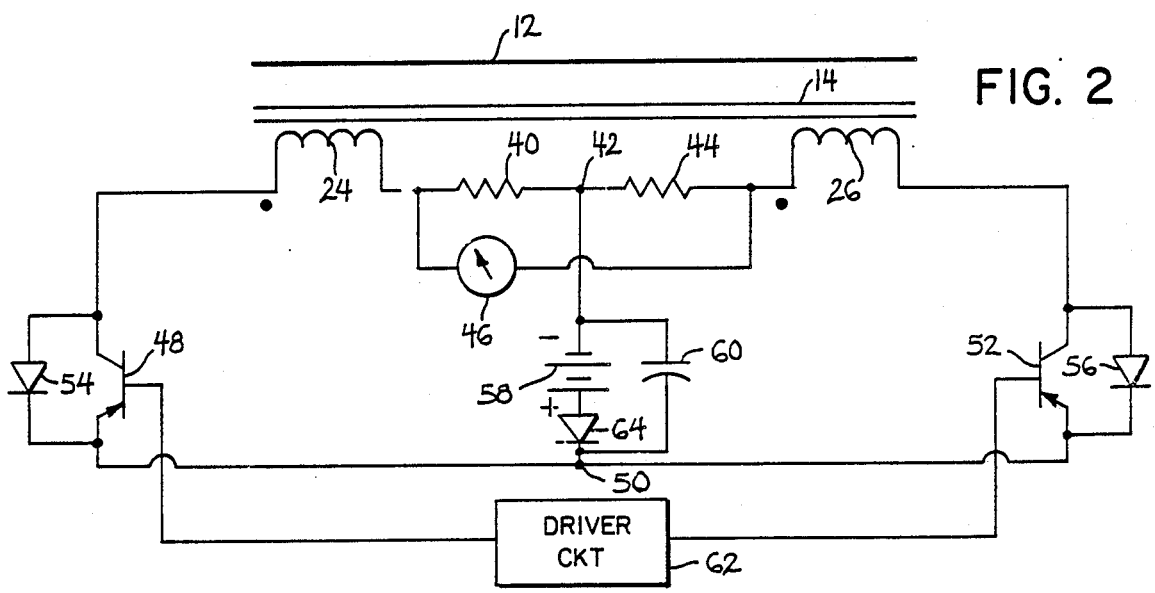
FIG. 2
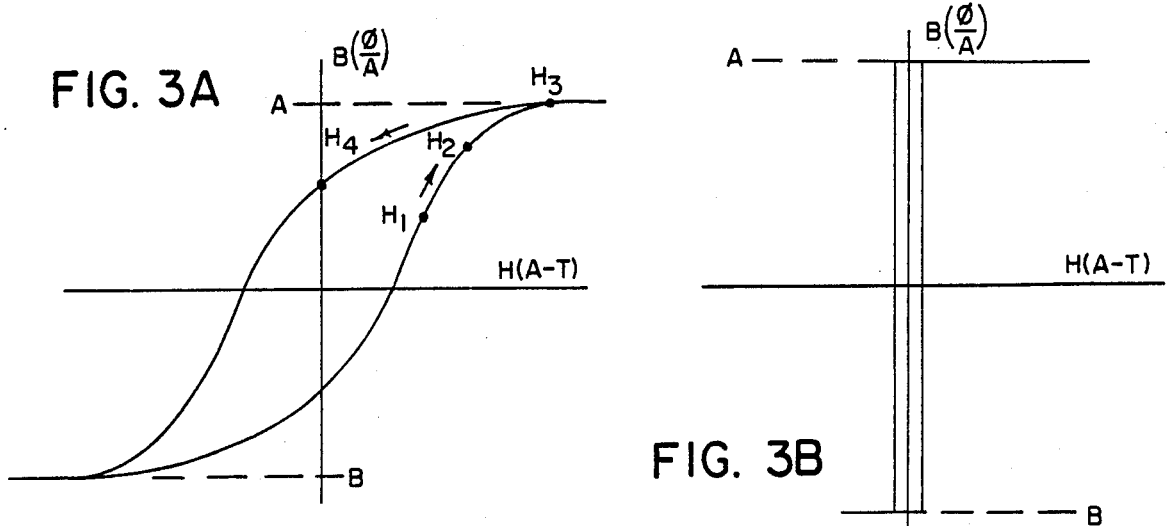
FIG. 3A
FIG. 3B

NON-CONTACT AMMETER

The present application ia a continuation application of U.S. patent application Ser. No. 06/785,972 filed Oct. 10, 1985 and now abandoned.

The present invention relates to an improved non-contact ammeter and more particularly to one suitable for measuring direct current. The ammeter may comprise a so-called "clamp-on" ammeter.

An ammeter measures the electrical current flowing through a conductor. A conventional ammeter is connected directly in series in the electrical circuit. The current in the conductor passes through a coil in the ammeter to deflect the coil and an associated pointer to indicate the amount of current in the conductor. Digital ammeters are also connected directly in the circuit for ascertaining the current and providing an indication of its magnitude.

Because the ammeter is connected in series in the circuit, the circuit must be broken, the ammeter removed, and the circuit reconnected at the conclusion of the current measurement. However, the breaking and reconnection of the circuit may be inconvenient or impossible. The meter can be left continously in the circuit but may then be subject to damagingly high currents by reason of such connection.

There has therefore arisen a need for, and corresponding development of, non-contact ammeters that do not need to be connected directly in the circuit in order to measure current. The direct connection can be avoided by replacing it with an electromagnetic inductive coupling. A magnetic core is placed around the current carrying conductor so that the current carrying conductor becomes a single turn primary winding for the core. A secondary winding is placed on the core and provides an output proportional to the current in the conductor by transformer action. The secondary winding is connected to a meter or digital readout. The lack of a direct connection also provides desirable electrical isolation when dangerously high voltages are involved. Such an ammeter may have a hinged core for placing the core around the current carrying conductor and is thus often termed a "clamp-on" ammeter.

Such ammeters work well for measuring alternating current since the bi-directional nature of such current insures transformer action and proportionality between the curent in the conductor and the output of the secondary winding provided to the meter.

However, this is not the case with direct current. The undirectional nature of direct current drives the core into a state of magnetic saturation in which the magnetic flux in the core no longer changes. No transformer action, secondary winding output, or measurment of direct current can then result.

Various attempts have been made to provide non-contact direct current ammeters. One such non-contact ammeter uses a transductor. This type of device employs two oppositely poled magnetic cores around the current carrying conductor. Such an ammeter can detect the magnitude of the direct current but not its polarity. Further, it cannot detect alternating current. This can be a serious shortcoming for certain applications, for example, servicing and trouble-shooting electric motor drives. And, the need for two magnetic cores adds substantially to the cost of the instrument.

Another type of non-contact direct current ammeter utilizes a magneto-sensitive resistor or a Hall effect generator. The Hall effect generator is placed in an air gap in the magnetic core. With a sufficiently large air gap, there will be a linear relationship between the direct current in the current carrying conductor coupled to the core and the flux appearing in the air gap. The Hall device senses the flux and provides a corresponding signal to the meter.

However, a very accurate, and hence expensive, Hall effect device is required to provide the appropriate output signal. Further, the output signal is small in magnitude requiring considerable amplification and additional increases in cost.

A Hall effect device ammeter also suffers from an offset due to hysteresis in the magnetic core. While an appropriately designed air gap can reduce the offset, it still does not exist and usually requires a zero adjust of the ammeter each time a reading is taken.

When measuring large direct currents with ammeters of the above described types, the electromagnetic coupling between the current carrying conductor and the core may become quite high. Considerable physical force is then required to take the core off the conductor. Or, the current in the conductor must be interrupted.

A different approach to utilizing a Hall effect device places a coil around the magnetic core. The coil is energized by a current supply to the extent necessary to null out the flux in the core generated by the current in the current carrying conductor. The loss of flux in the core is sensed by the Hall effect device in an air gap. The energization of the coil necessary to null out the flux becomes an indication of direct current magnitude.

This type of ammeter can measure both direct current and alternating current. However, it suffers a number of shortcomings. If the coil is deenergized with a large direct current in the current carrying conductor, there will be a residual magnetism in the magnetic core due to hysteresis. If the instrument is, thereafter, used without a direct current in the conductor, a current will be required in the coil to reduce the residual magnetism to zero. This gives an erroneous zero reading and requires an offset or zero adjust. While, again, with a well-designed magnetic circuit, the offset may be minimized, it nonetheless does exist and can be troublesome at readings somewhat less than full scale.

Another disadvantage is the high power consumption of such ammeters. The current supply for the exciting coil must provide all the nulling magnetomotive force, as well as overcoming the resistance in the coil. The high power consumption required for these purposes makes it difficult to have a portable, battery operated instrument of this type.

It is, therefore, the object of the present invention to provide an improved non-contact ammeter capable of measuring direct current. The ammeter is not, however, so limited and the ammeter is also capable of measuring alternating current as well as rectified alternating current, either alone or combined with direct current. The ammeter of the present invention is highly suited for use in a clamp-on construction but can be used in other ways, as in a more or less permanent installation.

The power required to carry out the current measurement with the ammeter of the present invention is low, permitting the ammeter of the present invention to use a battery power supply.

The ammeter of the present invention is high in accuracy over a wide range of current magnitudes and requires no zero adjust prior to measurement in order to obtain an accurate reading.

It is economical in construction and operation and is capable of substantial trouble free operation for substantial periods of time.

In the ammeter of the present invention, a second winding is placed on the core. This winding is "second" with respect to the first, or primary, winding comprising the current carrying conductor. The second winding is connected to an electrical power supply. The second winding can be energized either by the current in the current carrying conductor or by the power supply. Either polarity of voltage may thus be established on the winding. The direction of flux change produced in the magnetic core by the energization of the second winding is determined by the polarity of the voltage on the winding. The core may be placed in the unsaturated state by selecting the polarity of voltage on the second winding, and corresponding direction of flux change in the core, that alters the flux condition in the core away from saturation. With the core in the unsaturated state, measurement of the direct current in the current carrying conductor from the output of the second winding can occur.

The core is continuously maintained in the unsaturated state by alternately energizing the winding from the current carrying conductor and from the power supply. This periodically reverses the polarity of the voltage on the second winding and the direction of flux change in the core. The flux changes in the core thus move the magnetic state of the core away from the saturated condition for one direction of flux flow. When saturation in the other direction is approached, the energization mode of the winding is altered to reverse the direction of flux change. The magnetic condition of the core then moves back toward saturation in the first direction. When saturation in this direction is approached, the energization mode is again altered to reverse the direction of flux change, and so on.

Sensing means may be provided in the ammeter to ascertain when the core approaches or briefly enters the saturated condition. The energization mode is then altered and the polarity of the second winding voltage reversed so that the direction of flux change is away from the saturated condition. A Hall effect generator in an air gap in the core, a search coil on the core, or a second winding current sensor may be used for this purpose.

In carrying out the present invention, a single second winding on the core may be connected to the electrical power source through a reversing means such as a bridge circuit. Or, a pair of second windings may be used that are alternately energized, one by the primary winding and then the other by the electrical power source.

The invention will be further understood by reference to the following detailed description and the drawing, in which FIG. 1 is a diagrammatic view of certain components of the ammeter of the present invention illustrating an ammeter of clamp-on construction;

FIG. 2 is a schematic diagram of the ammeter of the present invention including the components of FIG. 1;

FIG. 3A is a hysteresis diagram for a conventional magnetic material;

FIG.3B is a hysteresis diagram for a highly efficient magnetic material;

Figure 8A:
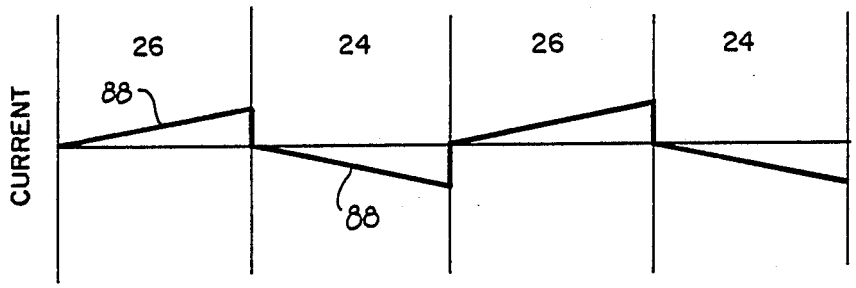
Figure 8B:
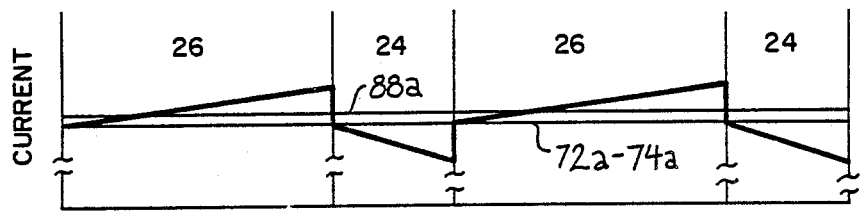
Figure 8C:
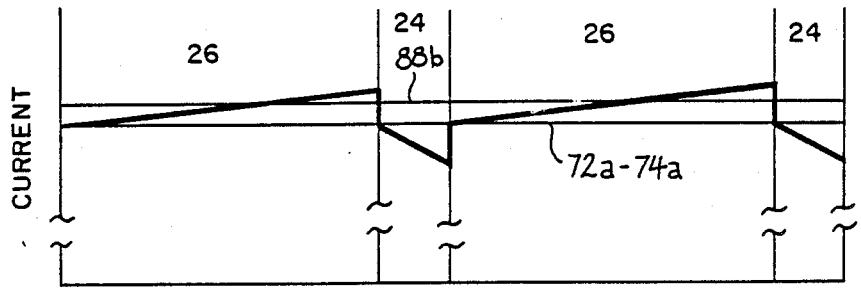
Figure 9:
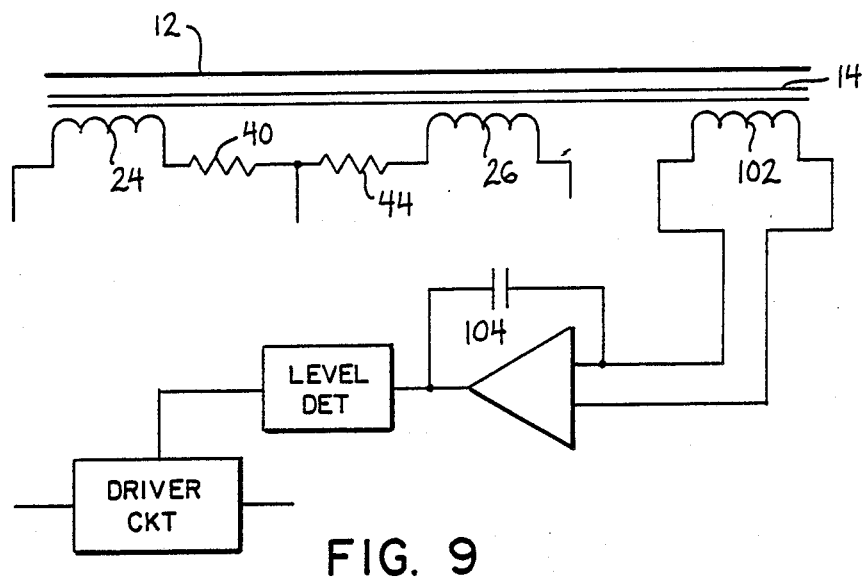

FIGS. 8A–C shows current conditions in the second winding when measuring direct currents of different levels;

FIG. 9 is a partial schematic diagram showing another embodiment of a means for controlling the energization modes of the ammeter.

Figure 10:
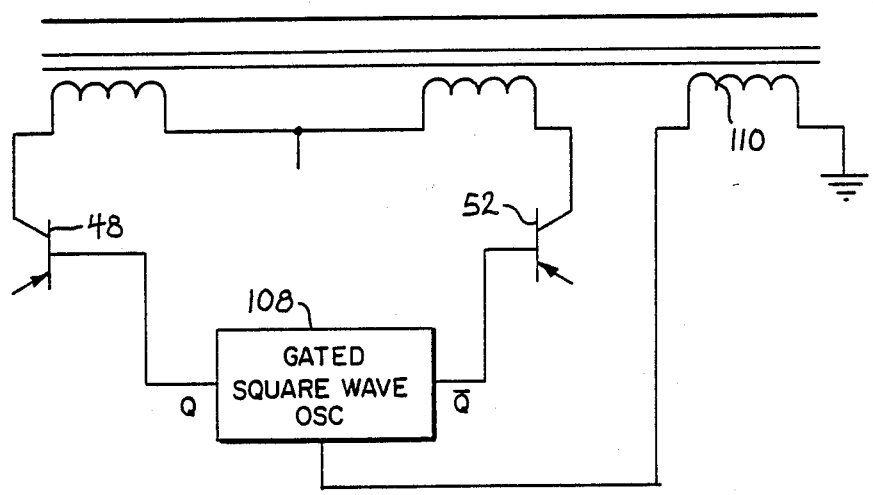

FIG. 10 is a partial schematic diagram showing a further embodiment of a means for controlling the energization modes of the ammeter.

FIG. 11 is a partial schematic diagram showing yet another embodiment of a means for controlling the energization modes of the ammeter.

FIG. 12 is a diagrammatic view of a further embodiment of the ammeter 10 of the present invention.

FIG. 13 is a schematic diagram of the embodiment of the ammeter of FIG. 12 showing circuitry therefor.

FIG. 1 shows the present invention in an ammeter 10 of clamp-on configuration. Ammeter 10 is suitable for measuring the direct current in current carrying conductor 12. For this purpose, ammeter 10 includes core 14 of magnetic material, formed, for example, from a plurality of sheets of ferro-magnetic iron lying parallel to the plane of the paper. Core 14 is mounted in housing 16 and surrounds current carrying conductor 12 which forms a first or primary winding for the core. Core 14 also contains second windings 24 and 26. To facilitate the placement of core 14 around conductor 12, the core may be formed of two halves joined by hinge 18. One core half is movable against the bias of spring 20 by lever 22 to separate the halves so the core may be placed around the conductor. Core 14 may also be formed as a solid annulus having conductor 12 threaded through it, as at the time of wiring. Conductor 12 may form more than one turn around core 14, if desired.

FIG. 2 is a schematic diagram of ammeter 10. Elements previously referred to are identified by the same numbers. Conductor 12 carrying the current to be measured is proximate core 14 in the manner shown in FIG. 1. Core 14 contains second windings 24 and 26. Windings 24 and 26 may be similarly wound as indicated by the polarity markings in FIG. 2. Resistor 40 is connected intermediate one end of winding 24 and common junction 42. Resistor 44 is connected intermediate one end of winding 26 and common junction 42. Resistors 40 and 42 may be of relatively low impedance, for example, 1 ohm. Meter 46 providing the indication of current magnitude is connected intermediate the end of winding 24 and resistor 40 and the end of winding 26 and resistor 44.

The other end of winding 24 is connected to the emitter-collector circuit of transistor 48. Transistor 48 may be of the PNP type having the collector terminal connected to winding 24 and the emitter terminal connected to a second common junction 50. The other end of winding 26 is connected to the emitter-collector circuit of transistor 52. Transistor 52 may also be of the PNP type having the collector terminal connected to winding 26 and the emitter terminal connected to second common junction 50. Diodes 54 and 56 bridge the emitter-collector circuits of transistors 48 and 52, respectively. Diodes 54 and 56 are poled to conduct current in a direction opposite to that of the emitter-collector circuits of the transistors, as shown in FIG. 2.

Battery 58 is connected between junction 42 and junction 50. Capacitor 60 is connected in parallel with battery 58.

The base terminals of transistors 48 and 52 are connected to driver circuit 62 that alternately produces a turn-on signal to one or the other of transistors 48 and 52.

As noted above, conductor 12, which may be considered a single turn primary winding, and a second winding, which may be considered windings 24 and 26 collectively, may be inductively coupled through core 14. When such inductive coupling is occuring, the ampere-turns in the primary winding 12 must equal the ampere-turns in the second winding 24-26, neglecting the exciting current and other losses, or $$N_1 I_1 = N_2 I_2 \qquad (1)$$

With the number of turns in winding 12 and second winding 24-26 fixed by the construction of ammeter 10, the current in second winding 24-26 becomes directly proportional to the current in current carrying conductor 12 and may be used to measure the latter.

In order for the inductive coupling between the primary and second windings to exist, core 14 must be in an unsaturated flux condition. The flux condition of a magnetic material is often illustrated by a hysteresis diagram that relates magnetizing force to the amount of magnetism produced in the material. The magnetizing force or magnetomotive force (mmf) is designated by H and is expressed in terms of ampere-turns. The magnetism is expressed as flux density B which is the flux $\phi$ divided by the cross-sectional area A of the core material.

FIG. 3A shows a typical hysteresis diagram for a conventional ferromagnetic material. Increasing the magnetomotive force H in one direction increases the magnetic flux density B, as for example in accordance with the portion of the graph labelled $H_1$–$H_2$. As the magnetomotive force is increased, a point $H_3$ is reached at which further increases in the magnetomotive force produce little increase in the flux density. In such a condition, the core is said to be saturated. In FIG. 3A, level A represents the saturated flux level in one direction of flux flow since further increases in magnetomotive force produce no further increases in flux density. Decreasing the magnetomotive force H from $H_3$ to $H_4$ in FIG. 3A reduces the flux density and moves the material out of the saturated state. The difference in magnetic flux between $H_1$–$H_2$ and $H_3$–$H_4$ is due to the hysteresis of the magnetic material. The ordinate at $H_4$ represents the flux density remaining in the core when the magnetomotive force has been reduced to zero. Increasing the magnetomotive force sufficiently in the other direction will drive the core into saturation in the other direction of flux flow, at flux level B. The range of flux densities between levels A and B is the unsaturated condition of changeable flux in which inductive coupling between the windings can occur through core 14.

FIG. 3B shows a highly efficient magnetic material suitable for use in core 14. In such a material only a small magnetomotive force is required to drive the material into a maximum flux, saturated, condition in which further increases in the magnetomotive force produce little increase in flux density.

The small magnetomotive force and exciting current needed to operate core 14 of the type shown in FIG. 3B helps maintain the proportionality between the current in current carrying conductor 12 and the current in second winding 24-26 noted in equation (1). For purposes of analyzing the operation of the circuit of FIG. 2, it may be assumed that an infinitesimally small exciting current is required, making equation (1) true.

The current in current carrying conductor 12 applies a magnetomotive force to core 14 that will ultimately drive it into saturation in one flux flow direction or the other. If the current is an alternating one, its periodic reversal will move core 14 out of saturation in one direction, through the region A-B in FIG. 3 toward saturation in the other direction. The changing flux in the region A-B of FIG. 3 permits inductive coupling and the measurement of the current in conductor 12 by the output of second winding 24-26 on core 14.

With direct current in conductor 12 this is not the case. The unidirectional nature of direct current drives core 14 into saturation in one direction of flux flow and its stays there. There is no changing flux, no inductive coupling and no output in winding 24-26 that can be used to measure the current in conductor 12. If direct current is to be measured, core 14 must be removed from the saturated condition and operated in the unsaturated condition in region A-B in FIG. 3.

It is recognized, that in accordance with the well-known Faraday's law, there is a relationship between the change of flux through a winding and the voltage applied to it. Specifically, the rate of change of flux is proportional to the voltage or $$E = N \frac{d\phi}{dt} \qquad (2)$$

N is the number of turns in the winding and is usually fixed. In accordance with Equation 2, by establishing the magnitude of the voltage on a winding, the magnitude of the rate of change of the flux can be controlled. By controlling the polarity of the voltage, the direction in which the flux changes may be controlled.

Thus by placing a voltage of the appropriate polarity on second winding 24-26, the flux in core 14 linking current carrying conductor 12 and the second winding may be changed in a manner to remove core 14 out of, or away from, the state of saturation caused by the direct current in conductor 12 to the unsaturated condition in which the inductive coupling necessary for current measurement can occur. To avoid going into saturation in the other direction of flux flow, the polarity of the voltage on winding 24-26 must be reversed after a period of time so that the direction of flux change reverses back toward the original saturation condition. After a period of time, the voltage on second winding 24-26 is again reversed and so on to continuously keep core 14 in the unsaturated condition.

To this end, ammeter 10 of the present invention periodically alternates between a mode in which second winding 24-26 is energized by the current in conductor 12 being measured, to establish one voltage polarity, and a mode in which second winding 24-26 is energized by battery 58, to provide the other voltage polarity.

Figure 4:
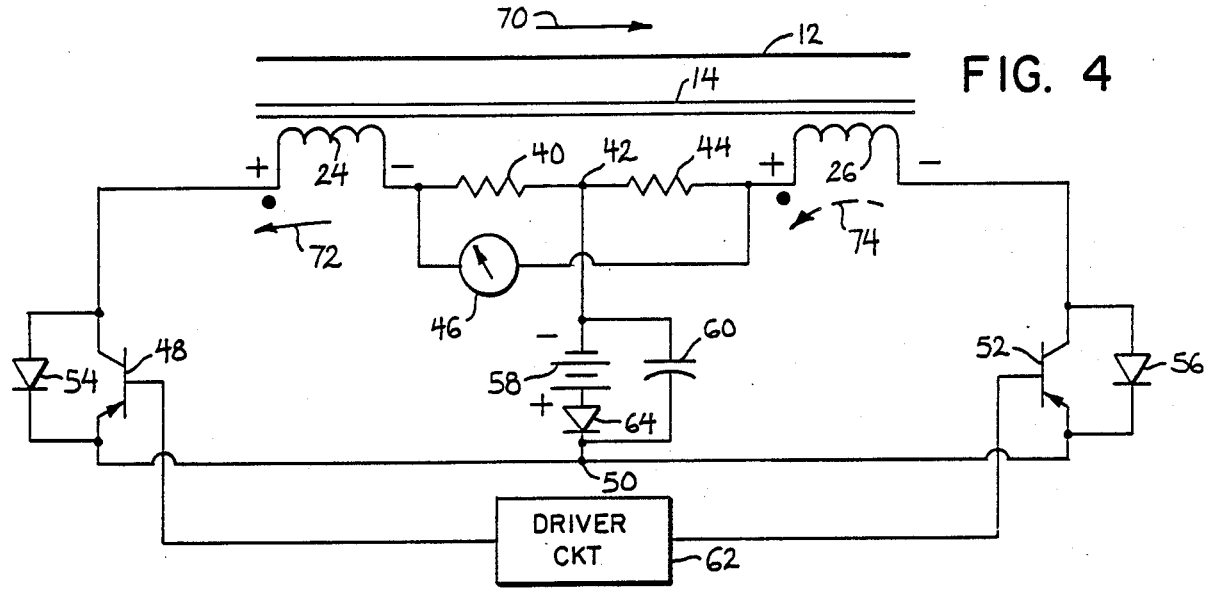
FIG. 4 is a schematic diagram similar to FIG. 2 showing the condition of the ammeter in one energization mode.

The operation is as follows. FIG. 4 is a schematic diagram similar to FIG. 2. It is assumed that a direct current 70 flows from left to right in conductor 12 in the direction of the arrow. The condition of core 14 is not capable of altering the magnitude of this current.

In accordance with Lenz' law, the current appearing in second winding 24-26 will be of a nature to oppose the current in conductor 12. The current in winding 24-26 will thus tend to flow from right to left. It may be assumed that transistor 48 has been rendered conductive by driver circuit 62 and transistor 52 has been rendered non-conductive. Current 72 circulates in winding 24 in a counterclockwise direction, as shown in FIG. 4. A conductive path for current 72 exists through diode 54 and battery 58 as a load. A voltage is generated across winding 24 of a magnitude and polarity sufficient to cause the current flow to occur. The polarity of the voltage on winding 24 is as shown in FIG. 4, since winding 24 acts as a source for battery 58 as a load. The ammeter is thus energized by current 70 in conductor 12.

No conductive path exists for any counterclockwise current 74 established by the voltage on winding 26 since transistor 52 is non-conductive and diode 56 is not poled for current condition in that direction.

Assuming core 14 is not saturated, the inductive coupling of current carrying conductor 12 and winding 24 causes the current 72 in winding 24 to be proportional to the current in current carrying conductor 12 in accordance with equation (1). The actual ratio between the current 70 in conductor 12 and current 72 in winding 24 is determined by the number turns in second winding 24. This winding may have a large number of turns so that only a small current 72 flows in winding 24.

The current 72 through winding 24 divides with a portion going through meter 46 and resistor 44 and a portion going through resistor 40 in a voltage dividing action. The current flow through meter 46 provides an indication of the magnitude of the current 70 in current carrying conductor 12.

Assuming a zero voltage drop across diode 54 and no resistance in winding 24, the voltage across winding 24 must be equal to that of battery 58, for example, 9 volts. The voltage across winding 24 is thus established by battery 58. The voltage established across winding 24 establishes the magnitude of the rate of change of flux in core 14 in accordance with Faraday's law, equation (2). Since the battery voltage is constant, the rate of flux change is constant.

If current 72 were permitted to flow indefinitely, the changing flux would eventually saturate core 14 in one or the other of its flux flow directions, for example, at point A in FIG. 3. No further flux changes would occur in core 14 and the inductive coupling and sensing of the current in current carrying conductor 12 would be lost.

Figure 5:
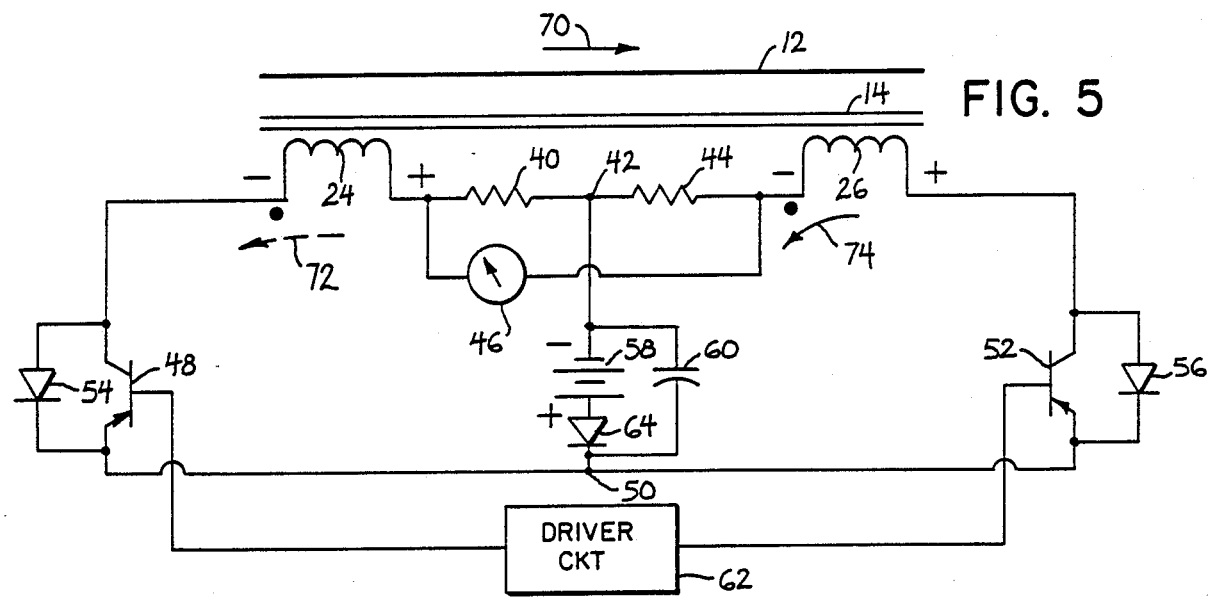
FIG. 5 is a schematic diagram showing the condition of the ammeter in another energization mode.

To avoid this, when the flux in core 14 attains a predetermined level, transistor 52 is rendered conductive and transistor 48 rendered non-conductive. This causes current 74 to become established in winding 26, both by the action of the voltage of battery 58 and the pre-existing induced voltage on winding 26. The direction of current 74 flowing through battery 58 is such as to cause the battery to become a source for winding 26 as a load. The ammeter is now energized by battery 58. The polarity of the voltage on winding 26 reverses, as shown in FIG. 5. As before, the magnitude of the voltage on the winding is established by battery 58.

The reversal of the polarity of the voltage on winding 26 reverses the direction of the change of flux in core 14, moving the flux condition in core 14 in a direction away from its previous condition, for example, away from saturation at point A toward point B in FIG. 3.

Since core 14 is unsaturated, there is an inductive coupling of current carrying conductor 12 and winding 26 that permits the magnitude of current 74 in the latter to indicate the magnitude of the current 12 in the former in accordance with equation (1).

The current 74 through winding 26 divides with a portion going through meter 46 and resistor 40 and a portion going through resistor 44 in a voltage dividing action. The current flow through meter 46 provides an indication of the magnitude of the current 70 in current carrying conductor 12.

The reversal of the direction of flux change in core 14 reverses the polarity of the voltage across winding 24, terminating current 72 since diode 54 is reversed biased and transistor 48 is non-conductive.

When the flux level in core 14 has been moved toward point B by a desired mount, transistor 48 is again rendered conductive and transistor 52 rendered non-conductive. This terminates current 74 and permits current 72 to flow again. This reverses the direction of the flux change, avoiding saturation of core 14 and maintaining an indication of the magnitude of the current in current carrying conductor 12 on meter 46. Ammeter 10 is again energized by current 70.

Thereafter, transistor 52 is again rendered conductive and transistor 48 rendered non-conductive. This terminates current 72 and reestablishes current 74 to provide a further indication of the magnitude of current 70 on meter 46. Ammeter 10 is again energized by battery 58.

The current through meter 46 used to indicate a magnitude of the current in current carrying conductor 12 alternates between that provided by current 72 and that provided by current 74. The mechanical damping of meter 46 compensates for any transient interruption of the current as transistors 48 and 52 are switched.

If current 70 in current carrying conductor 12 is reversed to flow, for example, from right to left, the function and operation of windings 24 and 26 and transistors 48 and 52 becomes the reverse of that described above. The ability of ammeter 10 to function with a reversed current 70 permits the measurement of alternating current in conductor 12 so that the ammeter can measure direct current, alternating current or a combination of d.c. and a.c.

It will be appreciated, that the possibility of reversed current in conductor 12 calls for the two transistor-diode pair configuration shown in FIGS. 4 and 5. If current 70 always flows in the same direction, one diode and one transistor can be eliminated. If current 7/ always flow from left to right as in FIGS. 4 and 5, transistor 48 and diode 56 could be eliminated.

Since the flux of core 14 will go through the zero condition along the abscissa of the graph of FIG. 3 as the flux changes in the region A-B, the net physical forces between conductor 12 and core 14 will be zero. This permits easy removal of clamp-on core 14 from the conductor, particularly if of the type of core material shown in FIG. 3B is utilized.

Figure 6:
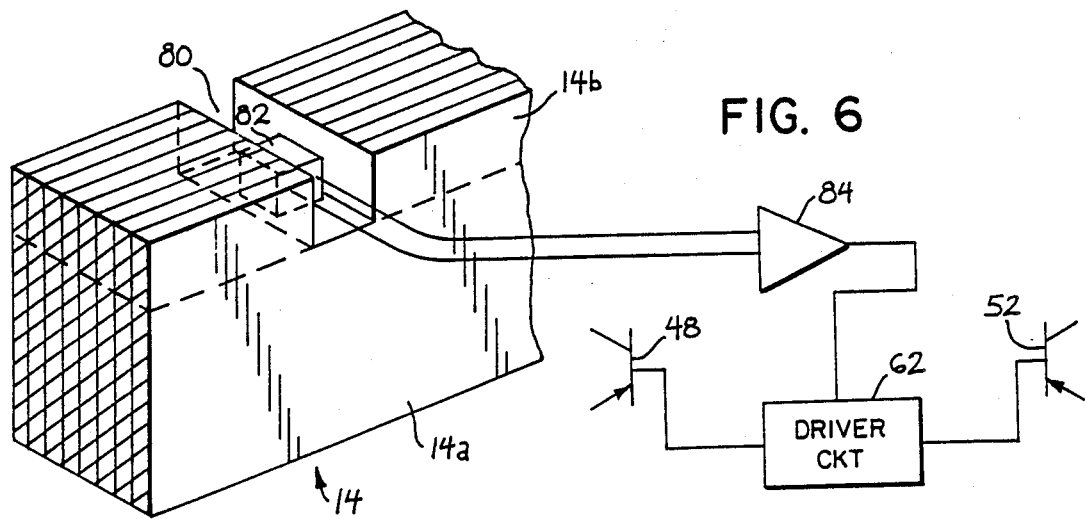
FIG. 6 is a fragmentary view showing a flux sensing means suitable for controlling the energization modes of the ammeter of the present invention.

Means are provided in ammeter 10 to alter the energization mode and reverse the voltage polarity of the second winding to avoid core 14 entering saturation or to limit the period time during which it remains in the saturated state. One such means is shown in FIG. 6. Air gap 80 is placed in core 14 normal to the direction of flux flow through the core. Air gap 80 may, for example, be 0.030 inches. Hall effect generator 82 is placed in air gap 80. Hall effect generator 82 is connected to amplifier 84 and to driver circuit 62.

The operation of ammeter 10, constructed as shown in FIG. 6, may be understood by considering core 14 to have two parallel magnetic paths. Flux flows through a path comprising the unnotched, or main, portion 14a of core 14 until the flux change produced by the voltage on one of the second windings causes a flux density in the core that saturates the main portion. When this occurs, flux begins to flow in a path containing the notched portion 14b, parallel to main portion 14a. Hall effect generator 82 detects the presence of flux in the notched portion 14b of core 14 and operates driver circuit 62 and transistors 48 and 52 to reverse the direction of flux flow, removing core 14 from saturation.

Hall effect generator 82 need only detect the existence and polarity of flux in the notched portion 14b of core 14 and thus may be an inexpensive component. The existence of flux is used to initiate the switching action and the polarity of the flux is used to turn on the appropriate one of transistors 48 and 52.

Figure 7A:
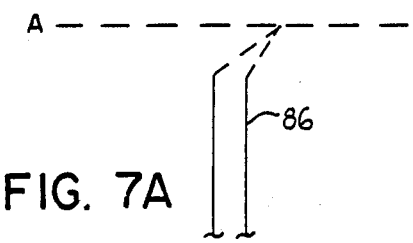
FIGS. 7A and 7B are portions of FIGS. 3B and 3A, respectively, showing operative states of the magnetic materials.
Figure 7B:
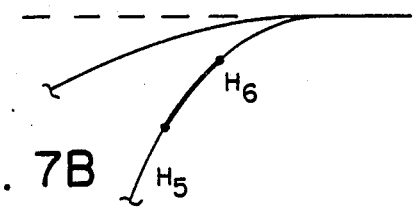

FIG. 7A shows a portion of the magnetic property curve for the core material shown in FIG. 3B. The dotted line shows the effect of introducing air gap 80 in core 14. A sharp break 86 is provided as the flux saturates the main portion 14a of core 14 and commences flow through the parallel portion 14b containing air gap 80. This results in highly accurate sensing by Hall effect generator 82, enhancing the operation of ammeter 10. FIG. 7B shows a portion of the magnetic property curve for the core material shown in FIG. 3A. With this type of core material, switching occurs generally in the region $H_5$-$H_6$. Because of the gently sloping nature of the hysteresis curve, a threshold circuit is preferably inserted in the circuitry to obtain proper switching action from Hall effect generator 82 at a flux level less than saturation.

Also, with the wider hysteresis loop shown in FIG. 3A, a considerable amount of current from battery 58 is required to excite the core material. This increases the drain on battery 58 and may slightly decrease - 1 or 2% - the accuracy of the ammeter. However, use of a core material of the type shown in FIG. 3A and 7B can provide significant economy to the construction of ammeter 10.

It will be noted, by comparing FIGS. 3A and 3B, that FIG. 3B has a higher ordinate. Since a greater period of time is required to travel the ordinate to saturation in FIG. 3B, the frequency of operation of an ammeter 10 incorporating such magnetic material is lower than one incorporating the magnetic material shown in FIG. 3A. Inasmuch as core losses are proportional to operating frequency to the 1.6 power, a reduction in operating frequency is highly desirable. In a typical embodiment, an ammeter having the core material of FIG. 3B may operate at 5 Hz whereas one incorporating the core material shown in FIG. 3A may operate at 30 Hz. Operating frequencies may also be selected with a view toward limiting current drain on battery 58 when it acts as a power source. The number of turns of second windings 24-26 also bear on switching frequencies - large number of turns to reduce current also reduces switching frequency.

In regard to the time intervals required for the energizing modes described above, it will be appreciated that integrating the voltage function in equation (2) with respect to time establishes that volt-seconds equals the difference in flux levels in core 14 times the number of turns of the winding or $$\text{volt seconds} = \Delta \phi \cdot N \qquad (3)$$

As noted before, the number of turns N is fixed in the construction of ammeter 10. Under the idealized conditions described above, the voltages on windings 24 and 26 were considered equal to the voltage of battery 58. Thus, the change in flux is directly proportional to the conduction periods of transistors 48 and 52 and the conduction periods would be equal to drive the flux equally in opposite directions.

In a practical embodiment of ammeter 10, this is not possible. The resistance of windings 24 and 26 and the voltage drops of diode 54 and transistor 52 prevent the voltage on windings 24 and 26 from equaling the battery voltage. When winding 24 is a voltage source for battery 58 as a load, as shown in FIG. 4, its voltage will be greater than the battery voltage by the amount of the voltage drop due to the resistance of winding 24 and the voltage drop across diode 54. When winding 26 is a load for battery 58 as a source, its voltage will be less by the amount of the voltage drop due to winding resistance and the emitter-collector voltage drop of transistor 52.

With respect to equation (3), since the voltages on second windings 24 and 26 are not equal, the seconds cannot be equal if the change in flux is to be equal. Rather, the conduction period for winding 26 must be greater than for winding 24.

FIG. 8 shows the effect of unequal conduction periods in the operation of core 14. At zero current in conductor 12, the conduction periods of transistors 48 and 52 are equal as core 14 is driven toward saturation in one direction, the voltage polarity of the second winding switches and core 14 is driven toward saturation in the other direction. Both windings 24 and 26 are energized by battery 58 since there is no current 70 to energize winding 24. This condition is shown in FIG. 8A showing the exciting current in second winding 24-26. The areas under the curves are equal, indicating there is no net d.c. exciting current present and providing highly accurate readings around zero to ammeter 10. The numbers in the graph show the period of energization of each winding 24, 26.

FIG. 8B shows a corresponding graph when measuring 50% of rated direct current 70 in conductor 12. The line 72a-74a represents the current in second winding 24, 26 corresponding to the 50% current in conductor 12 being measured. The exciting current is shown for the unequal conduction periods for windings 24 and 26 required by the differing voltages on the windings. Due to these unequal conduction periods a new direct current component 88a thus appears in the graph of FIG. 8B producing a slight alteration in the current measurement.

FIG. 8C shows similar conditions in ammeter 10 when measuring 100% of rated direct current in which direct current component 88b appears.

Since direct current 88a-b is linearly related to direct current 70 in conductor 12, it may be removed by reducing the number of turns on second winding 24-26, by a proportionate amount, thereby retaining the high accuracy features of the ammeter of the present invention.

In the idealized condition described above, the amount of energy supplied to battery 58 in the first mode (winding 24 as a voltage source) equals that withdrawn from battery 58 in the second mode (winding 26 as a load) so that there is no net power supply by battery 58. In actuality there will be a power draw on battery 58 due to the different voltages appearing in windings 24 and 26. Capacitor 60 is provided across battery 58 to receive the energy in the first energization mode since some types of batteries do not charge well. For batteries that do not charge well, diode 64 may be inserted in series with battery 58 to insure current 72 is provided to capacitor 60. Capacitor 60 is also capable of providing current in addition to that of battery 58 in the second energization mode, reducing the current drain on battery 58 and/or permitting a reduction in its size.

A second technique for reversing the voltage polarity in second winding is shown in FIG. 9 in which a third winding 102 is placed on core 14 and connected to integrator 104. Integration of the voltage across winding 102 indicates flux changes in core 14. Zero rate of flux change indicates saturation in core 14. A level detector 106 connected to integrator 102 operates driver circuit 62 and transistors 48 and 52.

Another circuit of this type is shown in FIG. 10. Driver 62 includes a gated square-wave oscillator 108 having complimentary outputs commonly termed "Q" and "Q", connected to the base terminals of transistors 48 and 52. A gated square-wave oscillator is an astable device. The device provides a signal at one output and then at the other output at a predetermined switching frequency in response to an input having one characteristic. The device retains the then existing output signal condition responsive to a different characteristic of the input signal.

The operation of gated square-wave oscillator 108 is controlled by the signal in third winding 110 placed on core 14.

The oscillating frequency of oscillator 108 is substantially higher than the operating frequency of ammeter 10, for example 1000 Hz. This avoids undesired drain on battery 58, as noted hereafter.

In operation, and assuming there is current in current carrying conductor 12, core 14 will be driven into saturation by this current. It then becomes necessary to determine which transistor 48, 52 to render conductive to operate core 14 out of the saturated condition into the unsaturated condition needed for inductive coupling. As ocillator 108 oscillates, one of transistors 48 and 52, for example transistor 48, will be turned on by the signal provided at one of the complementary outputs. The other transistor, for example transistor 52, will be turned off. If the voltage polarity on winding 24 obtained by the conduction of transistor 48 is not such as to drive core 14 out of saturation, no voltage will appear in winding 110. No signal is applied to oscillator 108 that would block its oscillating characteristic.

Oscillator 108 then oscillates to provide a signal to the other complementary output. Transistor 52 is turned on and transistor 48 is turned off. The voltage on winding 26 obtained by the conduction of transistor 52 will move core 14 out of saturation. A voltage will appear in winding 110 as a result of the changing flux in core 14. This signal is applied to the input of oscillator 108 by winding 110 and retains the signal on conducting transistor 52.

When core 14 enters saturation in the other direction, the voltage on winding 110 will collapse with the loss of changing flux. This removes the existing input signal from winding 110 to oscillator 108. This causes oscillator 108 to provide a signal at the other complementary output rendering transistor 52 non-conductive and transistor 48 conductive. The voltage then provided on winding 24 causes a flux change that moves core 14 back out of the saturated condition through the unsaturated region. The operation then repeats itself when core 14 reenters the saturation in the first direction.

The components of ammeter 10 are sized so that battery 58 can always supply sufficient current to remove core 14 from the saturated state within the period of oscillation of oscillator 108. The frequency of oscillation of oscillator 108 is chosen so that the current drain of battery 58 when core 14 is in the saturated state is minimized.

Another technique for providing the necessary conduction times to transistor 48 and 52 is shown in FIG. 11 in which a sensing means 120 connected to driver circuit 62 is provided to measure currents 72 and 74 through resistor 122 and to detect the high current levels associated with saturation. Sensing means 120 operates driver circuit 62 to remove core 14 from saturation. It is preferable that high current levels be achieved sharply to avoid drain on battery 58 prior to switching, as by use of a core material having the magnetic properties shown in FIG. 3B. It is also preferable to limit the periods during which the saturated conditions exist to avoid degradation of the accuracy of the instrument.

It should be noted that while two windings 24 and 26 have been shown in FIG. 1, and elsewhere for exemplary purposes, the circuit may employ, instead, only a single winding 130, as shown in FIG. 12. The polarity of the voltage of battery 58 applied to single winding 130 is reversed to permit it to function both as an electrical energy source and an electrical load. This may be accomplished by a reversing switch function shown diagrammatically in FIG. 12 with switch 132 that may be formed of a bridge configuration 134 shown in FIG. 13. Winding 130 is connected across one pair of terminals of bridge 134. Battery 58 is connected across the other pair of terminals of the bridge. The arms of the bridge contain appropriately poled parallel diode-transistor pairs 136 a, b, c, and d. The bases of the transistors in pairs 136a and 136c are connected to one output of driver circuit 62. The bases of the transistors in pairs 136b and 136d are connected to the other output of driver circuit 62. Meter 46 is connected in series with winding 130.

The operation of the circuitry shown in FIG. 13 is analogous to that shown and described in connection with FIGS. 4 and 5. The diodes are employed when winding 130 is energized by the current 70 in conductor 12 and battery 58 is a load. The transistors are employed when battery 58 is a source for winding 130. The full bridge configuration permits measuring current 70 in either flow direction.

The single winding embodiment shown in FIG. 13 may provide a higher turns ratio between the primary and second windings since with a single winding all of the turns are being used all of the time. With two second windings 24, 26 turns are split between the two windings and the windings are alternately used.

Various modes of carrying out the invention are contemplated as being within the scope of the following claims particularly pointing out and distinctly claiming the subject matter which is regarded as the invention.

I claim:

1. An ammeter for measuring the magnitude of direct current, alternating current, or a combination thereof in a conductor, said ammeter comprising:
   a single core capable of carrying a changeable magnetic flux, said core being in operative association with the conductor so that the conductor may serve as a primary winding for said core;
   second winding means operatively associated with said core for being inductively coupled to the conductor through the flux in the core so that the current in said second winding means may bear a relationship to the current in the conductor;
   means for sensing the magnetic flux condition of the core;
   voltage establishing means coupled to said second winding means for establishing the polarity of a voltage on said second winding means and the direction of flux change in said core, said voltage establishing means being responsive to said flux condition sensing means for periodically reversing the polarity of the voltage on said second winding means to reverse the direction of flux change in said core to maintain the inductive coupling between said second winding means and the conductor, said voltage establishing means including electrical power supply means coupled to said second winding means, said voltage establishing means providing a current flow path for the current in said second winding means in which said second winding means functions as an electrical source for said power supply means, as a load, and a given polarity of voltage is established in said second winding means and providing a current flow path for the current in said second winding means in which said second winding means functions as a load for the said power supply means, as an electrical source, and the polarity of the voltage on said second winding means is reversed; and
   means coupled to said second winding means and responsive to the instantaneous current in said second winding means for indicating the magnitude of the current in the conductor.

2. The ammeter according to claim 1 wherein said second winding means comprises a pair of windings connected across said electrical power supply means, and wherein said voltage establishing means provides a current path in one of said windings in which said one winding functions as an electrical source for said power supply means, as a load, and provides a current path in the other of said windings in which said other winding functions as a load for said powerr supply means, as a electrical source.

3. The ammeter asccording to claim 2 wherein said ammeter includes current control means interposed between said power supply means and said second winding means, said current control means including, for one of said second windings, a unidirectional current conduction means connected to said one winding and said power supply means and including, for the other of said second windings, a controllable current conduction means connected to said other winding and said power supply means, said ammeter including driver means for controlling the conduction of said controllable current conduction means.

4. The ammeter according to claim 3 wherein said unidirectional current conduction means comprises a diode.

5. The ammeter according to claim 3 wherein said controllable current conduction means comprises a transistor.

6. The ammeter according to claim 3 wherein said current control means comprises a parallel connected unidirectional current conduction means and a controllable current conduction means connected to each of said windings and said electrical power supply means, said controllable current conduction means being connected to said driver means.

7. The ammeter according to claim 6 wherein said driver means alternately renders each of said controllable current conduction means conductive.

8. The ammeter according to claim 6 wherein said unidirectional current conduction means and said controllable current conduction means of each pair are poled to conduct current in opposite directions.

9. The ammeter according to claim 3 wherein said windings of said pair each have one end coupled to a first common junction, said windings each have second ends coupled to said current control means, said current control means is connected to a second common junction, and said electrical power supply means is connected between said first and second common junctions.

10. The ammeter according to claim 1 wherein said voltage establishing means provides a voltage of predetermined magnitude on said second winding means.

11. The ammeter according to claim 10 wherein said voltage establishing means provides a constant voltage on said second winding means.

12. The ammeter according to claim 1 wherein said second winding means comprises a single winding and wherein said ammeter includes current control means for reversing the connection of said winding to said electrical power supply means to provide said given and reversed voltage polarities on said second winding means.

13. The ammeter according to claim 12 wherein said current control means comprises a bridge circuit having a first pair of terminals connected to said winding and a second pair of terminals connected to said electrical power supply means and having controllable current conduction means and unidirectional current conduction means connected in parallel between said terminals for establishing the connection between said first and second terminals.

14. The ammeter according to claim 1 wherein said voltage establishing means is further defined as controlling the periodic operation of said second winding means responsive to the sensing of certain flux levels in said core by said flux sensing means.

15. The ammeter according to claim 1 wherein said flux condition sensing means comprises an air gap through a portion of said core normal to the direction of flux flow and means for detecting flux conditions in said air gap.

16. The ammeter according to claim 1 wherein said flux condition sensing means comprises means for detecting a certain rate of change of the flux in said core.

17. The ammeter according to claim 1 wherein said core is further defined as being capable of being placed about the conductor.

18. The ammeter according to claim 17 wherein said core is formed with relatively movable portions permitting placement about the conductor.

19. The ammeter according to claim 1 wherein said electrical power supply means comprises a battery.

20. The ammeter according to claim 19 wherein said battery has capacitive means connected across it.

* * * * *